United States Patent
Chen et al.

(10) Patent No.: US 6,187,637 B1
(45) Date of Patent: Feb. 13, 2001

(54) METHOD FOR INCREASING ISOLATION ABILITY USING SHALLOW TRENCH

(75) Inventors: Ming-I Chen, Hsin-Chu; Chih-Hua Lee, Tao-Yuan, both of (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/277,882

(22) Filed: Mar. 29, 1999

(51) Int. Cl.[7] ................................................. H01L 21/8234
(52) U.S. Cl. ...................... 438/275; 438/276; 438/524; 438/527; 438/296; 438/424
(58) Field of Search ..................................... 438/275, 276, 438/524, 527, 296, 424

(56) References Cited

U.S. PATENT DOCUMENTS 5,504,030 * 4/1996 Chung et al. .
5,536,670 * 7/1996 Hsue .

\* cited by examiner

Primary Examiner—John F. Niebling
Assistant Examiner—Josetta Jones

(74) Attorney, Agent, or Firm—Harness, Dickey & Pierce, P.L.C.

(57) ABSTRACT

A method for increasing isolation ability is disclosed. A shallow trench into semiconductor device is formed on a wafer. Therefore the wafer owns a semiconductor substrate and wherein a first gate oxide layer is formed on the semiconductor substrate. A nitride layer is formed on the gate oxide layer. Then the method will include the following statement. Firstly a deep well layer is formed into the semiconductor substrate. Then patterning oxide layer and the nitride layer is carried out. Thereafter trenches is formed. The portion of silicon nitride layer and gate oxide layer will be etched according to the pattern of the gate oxide layer and the nitride layer. Sequentially first implanting a couple of device cell into the deep well of semiconductor substrate is achieved. Then the couple of device cell is annealed. The whole silicon nitride layer is removed. Not only the second implanting cell device will be obtained but also the third implanting cell device will be achieved. The first gate oxide layer is removed. A second gate oxide, a polysilicon layer and a tungsten silicide layer are in sequence deposited. Then the polysilicon gate is defined. The polysilicon gate is etched that abuts between the couple of cell device. Cell isolation implanted behind the trench wherein the isolation is formed thus excited between said couple of cell device. The cell device and cell isolation both are annealed. Consequentially a silicon oxide is conformably deposited in order to fulfill the trench. Finally the surface of silicon oxide is planarized.

22 Claims, 4 Drawing Sheets

METHOD FOR INCREASING ISOLATION ABILITY USING SHALLOW TRENCH

BACKGROUND OF THE INVENTION

1. Field of the Invention

The present invention relates the method for increasing isolation ability, more particularly by forming the shallow trench neighbouring between $BN^+$ ROM cell.

2. Description of the Prior Art

Basically the new fashion way, to semiconductor device will be gradually fabricated smaller than before. Especially for the new generation, the manufactured technology for ROM of semiconductor device will be advantageously the coming twenty-first century. The ideal memory would be low cost, high performance, high density, with low power dissipation, random access, non-volatile, easy to test, highly reliable, and standardized throughout the industry. Also, the better cell isolation is expected for increasing the strength of device anti-punch through. Unfortunately those memory technologies which did not offer these advantages to some extent were one by one successfully challenged by the ROM memories. Therefore, how to improve the better cell isolation performance could not wait too long.

SUMMARY OF THE INVENTION

In accordance with the present invention, a method is provided for forming a shallow trench that substantially can increase isolation ability. In one embodiment, a shallow trench into semiconductor device is formed on a wafer. Therefore the wafer owns a semiconductor substrate and wherein a first gate oxide layer is formed on the semiconductor substrate. A nitride layer is formed on the gate oxide layer. Then the method will include the following statement. Firstly a deep well layer is formed into the semiconductor substrate. Then patterning oxide layer and the nitride layer is carried out. Thereafter trenches is formed. The portion of silicon nitride layer and gate oxide layer will be etched according to the pattern of the gate oxide layer and the nitride layer. Sequentially first implanting a couple of device cell into the deep well of semiconductor substrate is achieved. Then the couple of device cell is annealed. The whole silicon nitride layer is removed. Not only the second implanting cell device will be obtained but also the third implanting cell device will be achieved. The first gate oxide layer is removed. A second gate oxide, a polysilicon layer and a tungsten silicide layer are in sequence deposited. Then the polysilicon gate is defined. The polysilicon gate is etched that abuts between the couple of cell device. Cell isolation implanted behind the trench wherein the isolation is formed thus excited between said couple of cell device. The cell device and cell isolation both are annealed. Consequentially a silicon oxide is conformably deposited in order to fulfill the trench. Finally the surface of silicon oxide is planarized.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Moreover, while the present invention is illustrated by a number of preferred embodiments directed to ROM cell device, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

Figure 1A:
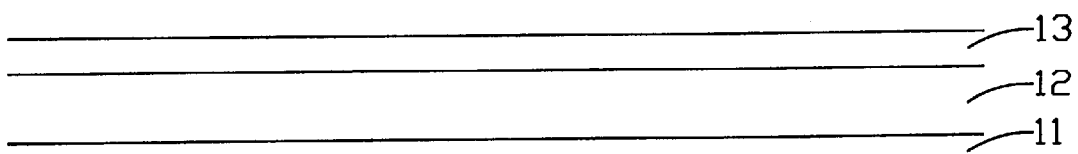
FIGS. 1A to 1J is a sectional-view according to the present invention.
Figure 1B:
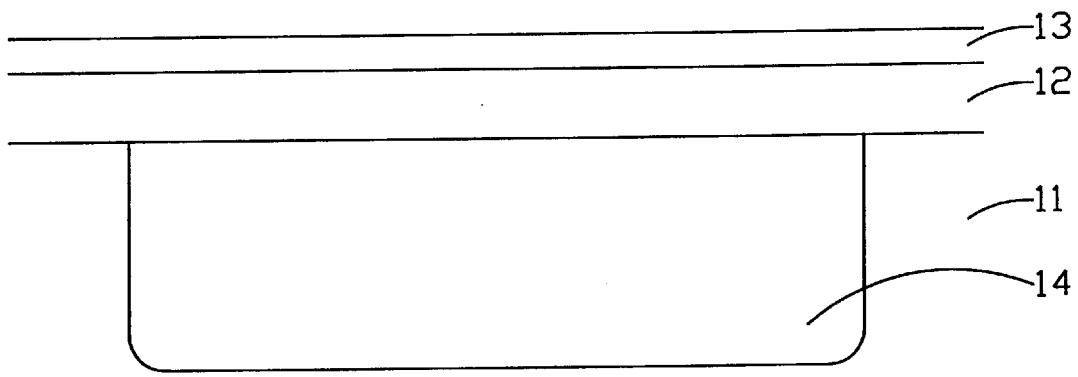
Figure 1C:
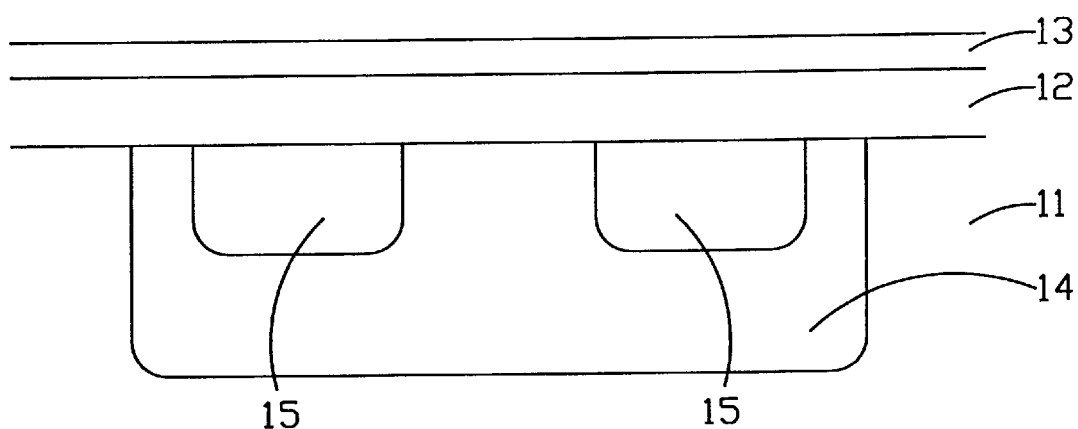
Figure 1D:
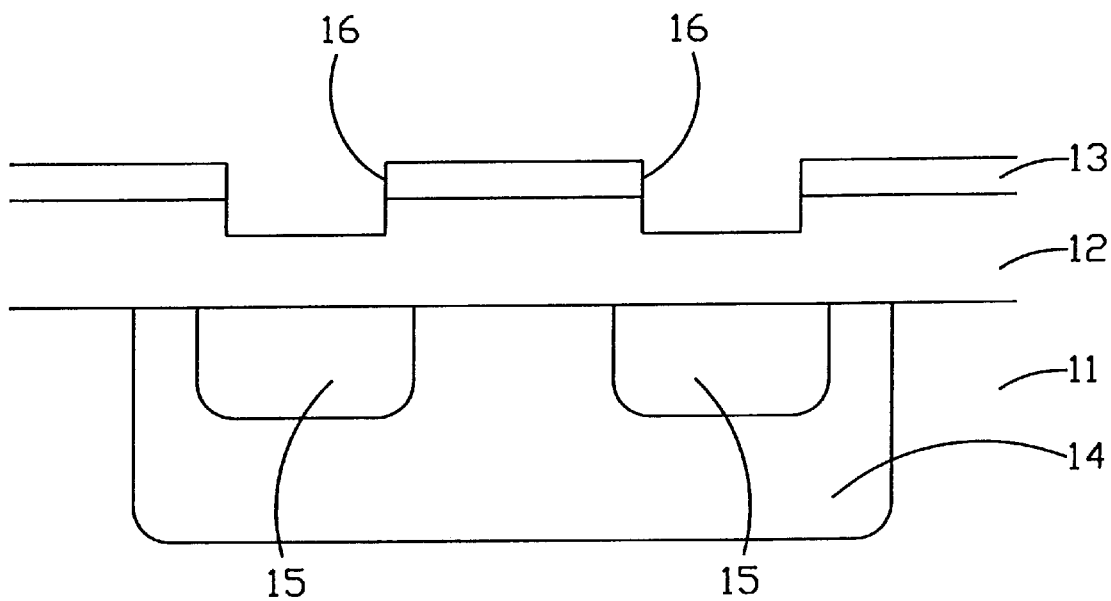
Figure 1E:
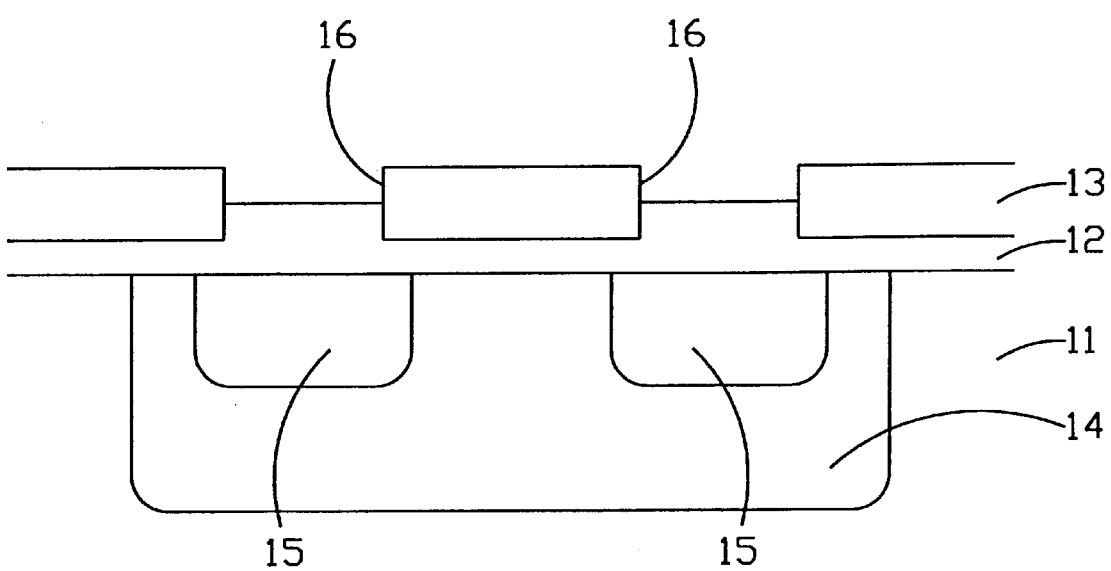
Figure 1F:
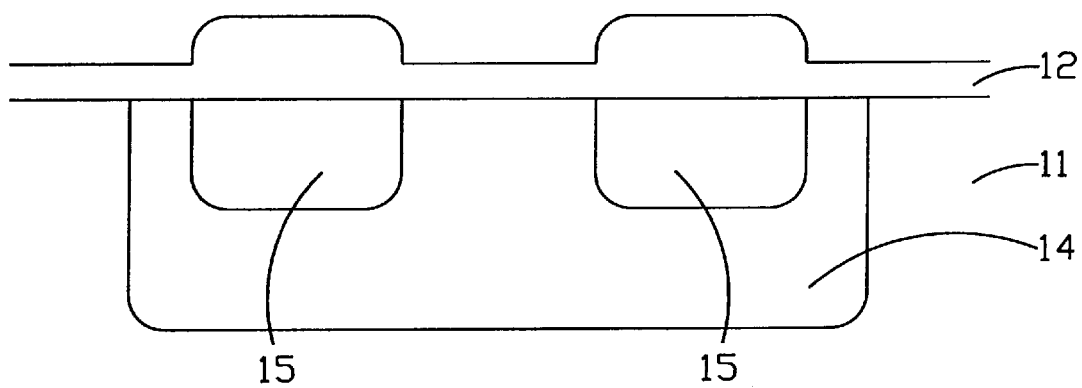
Figure 1G:
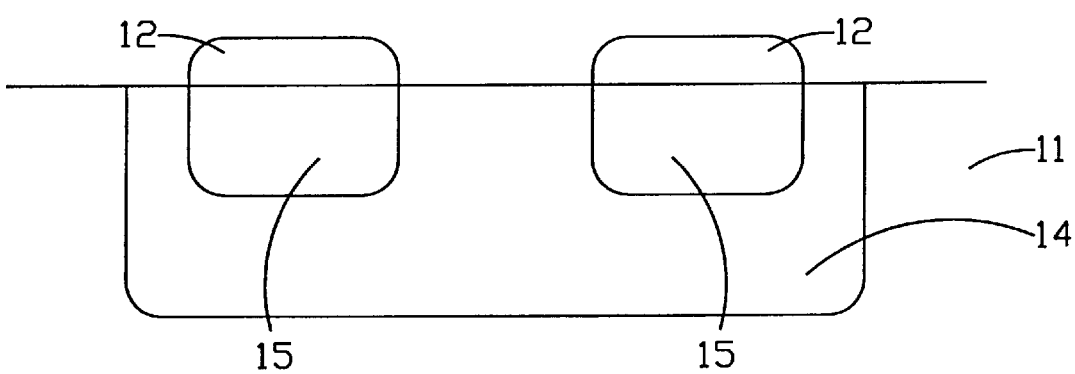
Figure 1H:
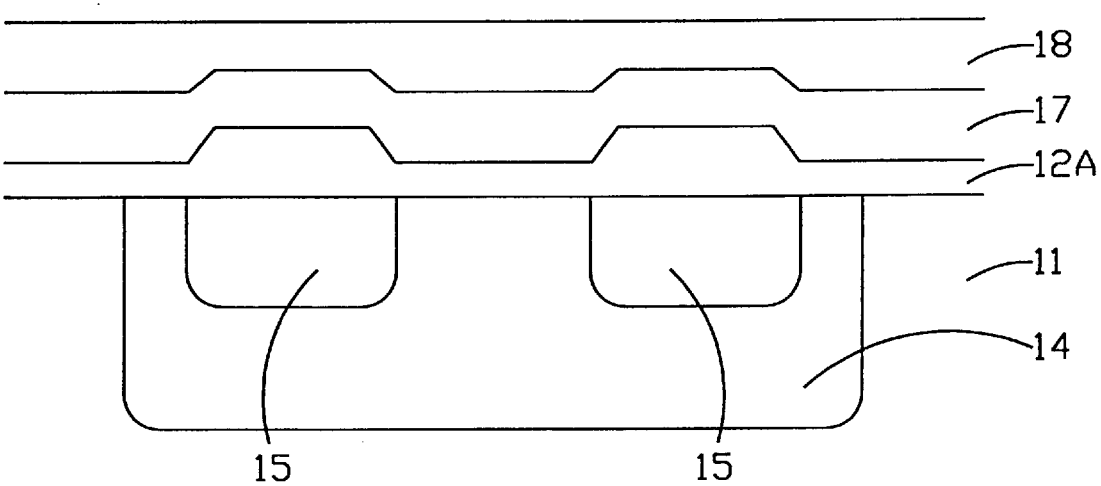
Figure 1I:
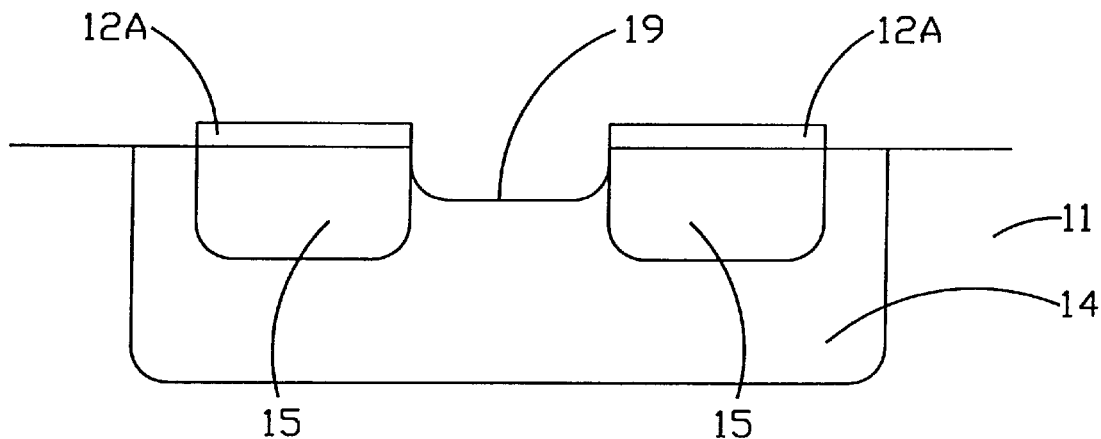
Figure 1J:
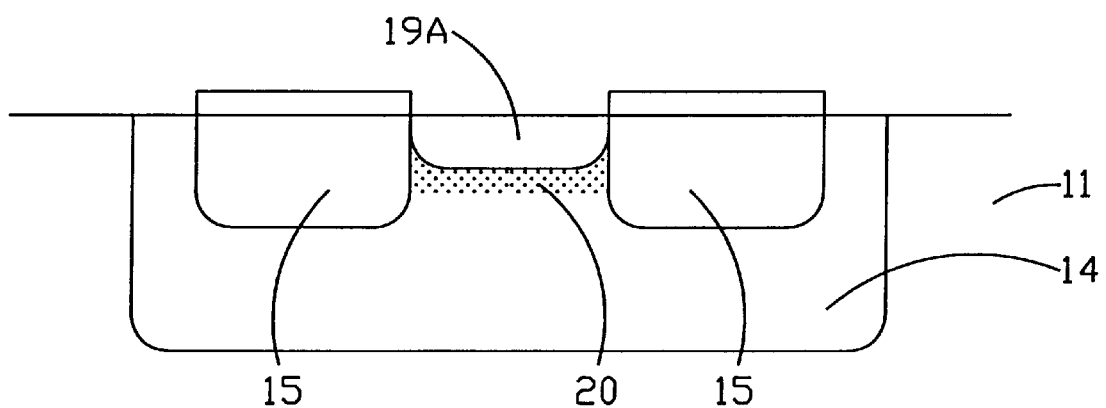

The process will start from providing a gate oxide layer 12 and a SiN layer 13 onto a substrate 11 as FIG. 1A. Then P-type well 14 is formed as shown 1B. Consequentially, FIG. 1C shows $BN^+$ ROM cell 15 being defined. And then as FIG. 1D, SiN layer 13 is etched. The next is $BN^+$ ROM cell 15 implanted. Sequentially FIG. 1E illustrates that $BN^+$ region is tempered and the gate oxide of $BN^+$ ROM cell 15 will be grew up. Also the thickness for gate oxide of $BN^+$ ROM cell 15 is higher than isolation region. Then SiN layer 13 is removed, as FIG. 1F. The threshold voltage adjustment implantation and NMOS anti-punch through implantation will be carried out. FIG. 1G schematizes gate oxide being dipped, however, it still leaves the portion of gate oxide 12 owning the thickness about few angstroms (Å). Consequentially gate oxide 12A, polysilicon layer 17 and tungsten silicide layer 18 are all deposited following with the above step as FIG. 1H. Then the next FIG. 1, after polysilicon gate is defined, removing polysilicon layer 17 and tungsten silicide layer 18, also formed trench 19 using conventional etching method. This conventional etching method is achieved using the different selectivity between Si and $SiO_2$. Also trench 19 will be located between one $BN^+$ ROM cell to another $BN^+$ ROM cell. FIG. 1J dedicates that cell isolation 20 is implanted. Wherein the defect existing between $BN^+$ ROM cell and isolation will be reduced using the tungsten silicide annealing method. Finally still referring FIG. 1J, $SiO_2$ is conformably deposited using PECVD or APCVD and etched back (or CMP). It will obtain the better isolation result.

While the invention has been described by way of examples and in terms of one preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

Although specific embodiments have been illustrated and described, it will be obvious to those skilled in the art that various modifications may be made without departing from what is intended to be limited solely by the appended claims.

What is claimed is:

1. A method for forming a shallow trench into semiconductor device formed on a wafer therefore said wafer having a semiconductor substrate and wherein a first gate oxide layer being formed on said semiconductor substrate and a nitride layer being formed on the said gate oxide layer, said method comprising:

forming a deep well layer into said semiconductor substrate;

patterning said oxide layer and said nitride layer thereafter forming trenches;

etching portion of said silicon nitride layer and gate oxide layer according to the pattern of said gate oxide layer and said nitride layer wherein said etching being performed with a set of process parameters;

first implanting a couple of device cell into said deep well of said semiconductor substrate;

annealing said couple of device cell;

removing whole said silicon nitride layer;

second implanting said cell device thereafter third implanting said cell device;

removing said first gate oxide layer;

depositing a second gate oxide and then a polysilicon layer thereafter a tungsten silicide layer;

defining said polysilicon gate;

etching said polysilicon gate which abuts between said couple of cell device;

implanting cell isolation behind said trench wherein said isolation being formed thus excited between said couple of cell device;

annealing said cell device and cell isolation;

conformably depositing a silicon oxide being fulfilled said trench; and planarizing surface of said silicon oxide.

2. The method according to claim 1, wherein removing portion of said silicon nitride layer comprises etching by a plasma etching process.

3. The method according to claim 1, wherein said etching gate oxide layer comprises etching by a plasma etching process.

4. The method according to claim 1, wherein said forming the deep well comprises P-type well.

5. The method according to claim 1, wherein said implanting the couple of device cell comprises $BN^+$ ROM cell.

6. The method according to claim 1, wherein said second implanting couple of device cell comprises threshold voltage adjustment implantation.

7. The method according to claim 1, wherein said third implanting couple of device cell comprises NMOS anti-punch through implantation.

8. The method according to claim 1, wherein said removing gate oxide layer comprises dipping method.

9. The method according to claim 1, wherein said annealing said cell device and cell isolation comprises tungsten silicide implantation.

10. The method according to claim 1, wherein said conformably depositing is selected from the method consisting of PECVD and APCVD.

11. The method according to claim 1, wherein said planarizing surface of said silicon oxide is selected from the method consisting of etching back and CMP.

12. A method for forming a shallow trench into ROM device formed on a wafer therefore said wafer having a semiconductor substrate and wherein a first gate oxide layer being formed on said semiconductor substrate and a nitride layer being formed on the said gate oxide layer, said method comprising:

forming a deep well layer into said semiconductor substrate;

patterning said oxide layer and said nitride layer thereafter forming trenches;

etching portion of said silicon nitride layer and gate oxide layer according to the pattern of said gate oxide layer and said nitride layer wherein said etching being performed with a set of process parameters;

first implanting a couple of device cell into said deep well of said semiconductor substrate;

annealing said couple of device cell;

removing whole said silicon nitride layer;

second implanting said cell device;

third implanting said cell device;

removing said first gate oxide layer;

depositing a second gate oxide and then a polysilicon layer thereafter a tungsten silicide layer;

defining said polysilicon gate;

etching said polysilicon gate which abuts between said couple of cell device;

implanting cell isolation behind said trench wherein said isolation being formed thus excited between said couple of cell device;

annealing said cell device and cell isolation;

conformably depositing a silicon oxide being fulfilled said trench; and planarizing surface of said silicon oxide.

13. The method according to claim 12, wherein removing portion of said silicon nitride layer comprises etching by a plasma etching process.

14. The method according to claim 12, wherein said etching gate oxide layer comprises etching by a plasma etching process.

15. The method according to claim 12, wherein said forming the deep well comprises P-type well.

16. The method according to claim 12, wherein said implanting the couple of device cell comprises $BN^+$ ROM cell.

17. The method according to claim 12, wherein said second implanting couple of device cell comprises threshold voltage adjustment implantation.

18. The method according to claim 12, wherein said third implanting couple of device cell comprises NMOS anti-punch through implantation.

19. The method according to claim 12, wherein said removing gate oxide layer comprises dipping method.

20. The method according to claim 12, wherein said annealing said cell device and cell isolation comprises tungsten silicide implantation.

21. The method according to claim 12, wherein said conformably depositing is selected from the method consisting of PECVD and APCVD.

22. The method according to claim 12, wherein said planarizing surface of said silicon oxide is selected from the method consisting of etching back and CMP.

* * * * *